(12) United States Patent
Claprood et al.

(10) Patent No.: US 6,636,418 B1
(45) Date of Patent: Oct. 21, 2003

(54) METHODS AND APPARATUS FOR INSTALLING ELECTRONIC CABINETS USING IMPROVED STABILIZATION TECHNIQUES

(75) Inventors: Edward Claprood, Southborough, MA (US); Lawrence Pignolet, Mapleville, RI (US); Gary Goulet, Pascoag, RI (US); F. William French, Littleton, MA (US)

(73) Assignee: EMC Corporation, Hopkinton, MA (US)

(*) Notice: Subject to any disclaimer, the term of this patent is extended or adjusted under 35 U.S.C. 154(b) by 0 days.

(21) Appl. No.: 09/941,060

(22) Filed: Aug. 28, 2001

(51) Int. Cl.⁷ .................................................. H02B 1/00
(52) U.S. Cl. ...................... 361/600; 361/679; 361/683; 361/724; 312/223.2; 248/346.6; 248/188.4
(58) Field of Search .................................. 361/600, 601, 361/606, 610, 679, 683, 724, 726; 312/223.2, 223.3, 351.1, 351.6, 351.7, 334.41, 322; 248/676, 678, 346.01, 346.02, 346.03, 346.06, 346.07, 349.01

(56) References Cited

U.S. PATENT DOCUMENTS

| | | | | |
|---|---|---|---|---|
| 4,232,919 A | * | 11/1980 | Stewart | 211/64 |
| 4,991,805 A | * | 2/1991 | Solak et al. | 248/188.4 |
| 5,580,016 A | * | 12/1996 | Sarrine | 248/188.2 |
| 5,688,030 A | * | 11/1997 | McAnally et al. | 248/500 |
| 5,887,962 A | * | 3/1999 | Tsai | 248/188.1 |
| 5,890,695 A | * | 4/1999 | Brewer, III | 248/638 |
| 6,059,384 A | * | 5/2000 | Ho | 248/346.04 |
| 6,179,264 B1 | * | 1/2001 | Moy et al. | 188/1.12 |

* cited by examiner

*Primary Examiner*—Boris Chervinsky
(74) *Attorney, Agent, or Firm*—Chapin & Huang, L.L.C.; David E. Huang, Esq.

(57) ABSTRACT

An electronic system has electronic circuitry and an electronic cabinet that houses the electronic circuitry. The electronic cabinet includes a frame that holds the electronic circuitry, a set of exterior members that mounts to the frame, and a stabilization assembly. The stabilization assembly has a base portion that attaches to the frame of the electronic cabinet in order to support the frame of the electronic cabinet over a floor surface, a pedestal portion, and a positioner. The positioner is configured to position the pedestal portion of the stabilization assembly relative to the frame such that the pedestal portion of the stabilization assembly is substantially wider than the frame along a particular direction when the pedestal of the stabilization assembly portion resides in an operating position relative to the frame. The pedestal portion can prevent the electronic cabinet from inadvertently being knocked over if pushed in the particular direction.

27 Claims, 9 Drawing Sheets

METHODS AND APPARATUS FOR INSTALLING ELECTRONIC CABINETS USING IMPROVED STABILIZATION TECHNIQUES

BACKGROUND OF THE INVENTION

A typical computer system includes computerized circuitry (e.g., circuit boards, a backplane, a power sub-system, a fan assembly, a set of disk drives, etc.) and a computer cabinet that houses the computerized circuitry. The computer cabinet typically includes a metal sub-frame assembly, or simply frame, for holding the computerized circuitry, and a set of exterior members (e.g., doors, side panels, etc.) that hang off the frame in order to cover and protect the computerized circuitry.

Such a computer system typically resides in a computer room that provides a consistent environment having an optimal temperature and humidity, as well as convenient access to power and network resources, e.g., the computer cabinet can reside over a raised floor for access to power and network cables. The computer room also isolates noise and heat generated by the computer system from other neighboring locations (e.g., from an adjacent office environment).

In general, computer cabinets are substantially box-shaped and have rectangular-shaped footprints that enable installers to position multiple computer cabinets next to one another, i.e., side-by-side in a row. A typical full-sized computer cabinet is approximately 19–24 inches wide (e.g., in order to be able to move the computer cabinet through a standard doorway), 30–36 inches deep and 60–72 inches high. Additionally, the typical full-sized computer cabinet can weigh roughly a half a ton when fully populated with computerized circuitry. For computerized circuitry configurations that require less space than that provided by a full-sized computer cabinet, manufacturers and installers typically place such configurations in shorter computer cabinets that are approximately 32–40 inches tall (e.g., half-height computer cabinets) which have the same size footprint as the full-sized computer cabinets.

Because of the size and weight of a typical computer cabinet, the above-described computer cabinet often further includes a set of wheels mounted to the bottom of the frame in order to facilitate movement of the computer cabinet along a floor surface. That is, a person (e.g., an installer) can "roll" the computer cabinet from one location to another across the floor (e.g., when rearranging computer equipment within a computer room). As mentioned earlier, the bottom of the computer cabinet typically is rectangular in shape, i.e., has a rectangular-shaped footprint. Typically, a wheel resides in each corner of the computer cabinet bottom for stability.

SUMMARY OF THE INVENTION

Unfortunately, there are deficiencies to the above-described conventional computer cabinets. For example, the full-sized computer cabinets may be too large for computer circuitry configurations that fit into substantially less space. Manufacturers that place such smaller configurations into full-sized computer cabinets waste resources, i.e., use more resources than are necessary (use more metal and plastic, use larger fan assemblies to maintain adequate air streams for cooling the computer circuitry, etc.).

Additionally, half-height computer cabinets may provide a smaller space that is more appropriate for smaller computer circuitry configurations. However, such half-height computer cabinets typically have footprints that are the same size as full-size computer cabinets. Accordingly, half-height computer cabinets require the same amount of computer room floor space as a full-sized cabinet. As a result, the use of half-height computer cabinets still results in wasted resources, since computer room floor space is often an expensive resource to provide and maintain.

In contrast to the above-described approaches to storing smaller computerized circuitry configurations into either full-sized computer cabinets or half-height computer cabinets which use the same size footprint as full-sized computer cabinets, embodiments of the invention are directed to techniques for installing an electronic cabinet (e.g., a computer cabinet) using a pedestal that is substantially wider than a cabinet frame along a particular direction. The pedestal enables the electronic cabinet to have a different footprint (e.g., narrower dimensions) than a standard full-sized computer cabinet, and prevents the electronic cabinet from easily tipping over and/or posing a safety hazard.

One embodiment of the invention is directed to an electronic system that has electronic circuitry and an electronic cabinet that houses the electronic circuitry. The electronic cabinet includes a frame that holds the electronic circuitry, a set of exterior members that mounts to the frame (e.g., side panels, doors, etc.), and a stabilization assembly. The stabilization assembly has a base portion that attaches to the frame of the electronic cabinet in order to support the frame of the electronic cabinet over a floor surface, a pedestal portion, and a positioner. The positioner is configured to position the pedestal portion of the stabilization assembly relative to the frame such that the pedestal portion of the stabilization assembly is substantially wider than the frame along a particular direction when the pedestal of the stabilization assembly resides in an operating position relative to the frame. The pedestal portion can prevent the electronic cabinet from inadvertently being knocked over if pushed in the particular direction. Accordingly, the pedestal portion can prevent electronic cabinets, which have a narrower footprint than a typical full-sized computer cabinet, from tipping over.

In one arrangement, the positioner of the stabilization assembly couples the pedestal portion to the base portion, and is configured to enable the pedestal portion to pivot about the base portion. Accordingly, the pedestal portion has the flexibility of being movable into operation (e.g., substantially perpendicular to the base portion and the frame to stabilize the electronic cabinet) or movable so that it is out of operation if not needed.

In one arrangement, the positioner is configured to selectively (i) permit the pedestal portion to substantially rotate relative to the base portion, and (ii) prevent the pedestal portion from substantially rotating relative to the base portion. For example, the positioner can include a locking mechanism that (i) enables the pedestal portion to substantially rotate relative to the base portion when in an unlocked state, and (ii) blocks the pedestal portion from substantially rotating relative to the base portion when in a locked state. The locking mechanism prevents someone from inadvertently enabling the pedestal portion to rotate so that it no longer operates. In one arrangement, the locking mechanism includes a hub that connects with the pedestal portion, and a locking bar coupled to the base portion. The locking mechanism is in the unlocked state when the locking bar is disengaged from the hub and in the locked state when the locking bar is engaged with the hub. Accordingly, a user can selectively lock and unlock the mechanism by moving the locking bar relative to the hub.

In one arrangement, the positioner further includes a bracket (e.g., for fastening the electronic cabinet to a palette during shipping or to a floor as earthquake protection). The bracket has a flanged portion that fastens to the base portion, and a movable portion (e.g., a nut) that is movable relative to the flanged portion and that meshes with the locking bar (e.g., threads around the locking bar) in order to enable the locking bar to selectively engage with and disengage from the hub when a user moves the movable portion. Accordingly, the bracket can be configured to provide stabilization to the cabinet as well as to remove the opportunity for accessing the locking bar when the bracket is not in place.

In one arrangement, the base portion includes a pair of wheels. The pedestal portion can include wheels as well (at a slightly higher height than wheels of the base portion). The wheels facilitate movement of the assembly along the floor surface when the bracket is removed from the base portion. However, the pair of wheels of the base portion are substantially prevented from rotating in order to inhibit movement of the assembly along the floor surface when the bracket is fastened to the base portion. Accordingly, the bracket can operate as a brake mechanism to prevent substantial movement of the electronic cabinet (e.g., rolling the cabinet across the floor) when in place.

In one arrangement, the positioner further includes a bracket retaining arm, coupled to the base portion, that prevents removal of the bracket from the base portion when the pedestal portion resides in a non-operating position relative to the base portion. Accordingly, the positioner can be configured to prevent someone from removing the bracket if the pedestal portion is out of operation.

The features of the invention, as described above, may be employed in electronic systems, devices and procedures as well as other components such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for installing an electronic cabinet (e.g., a computer cabinet) using a pedestal that is substantially wider than a cabinet frame along a particular direction. The pedestal enables the electronic cabinet to have a different footprint (e.g., narrower dimensions) than a standard full-sized computer cabinet, and prevents the electronic cabinet from easily tipping over and/or posing a safety hazard.

Figure 1:
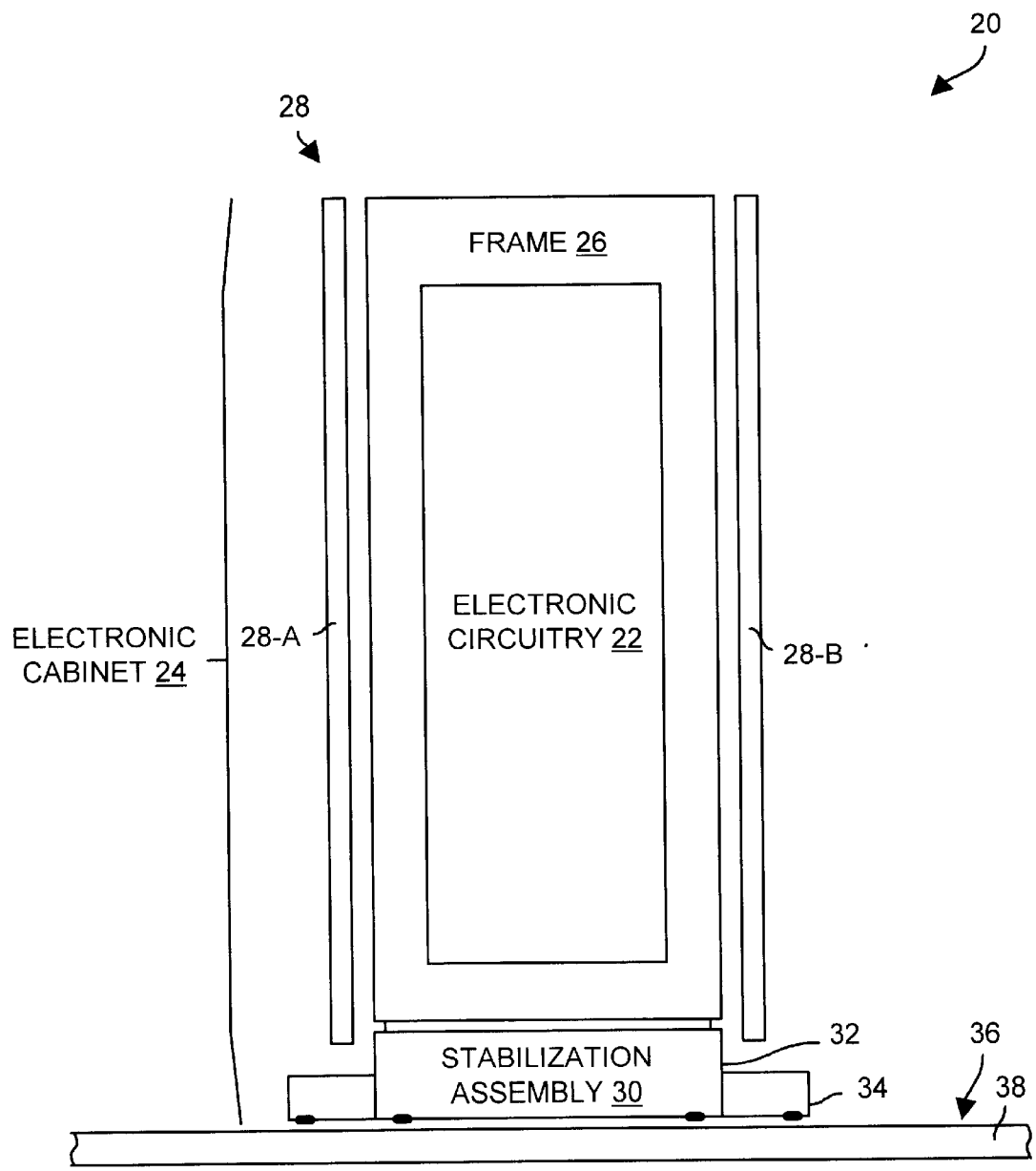
FIG. 1 shows a block diagram of an electronic system which is suitable for use by the invention.

FIG. 1 shows an electronic system 20 which is suitable for use by the invention.

The electronic system 20 (e.g., a computer system, a data storage system, etc.) includes electronic circuitry 22 and an electronic cabinet 24 that houses the electronic circuitry 22. The electronic cabinet 24 includes a frame 26 that holds the electronic circuitry 22, a set of exterior members 28 (e.g., side panels, one or more doors, a top member, etc.), and a stabilization assembly 30.

The stabilization assembly 30 includes a base portion 32 and a pedestal portion 34. The base portion 32 attaches to the frame 26 in order to support the frame 26 over a surface 36 of a floor 38. The pedestal portion 34 is capable of providing stability in order to prevent the electronic cabinet 24 from easily tipping over and/or posing a safety hazard, particularly when the electronic cabinet 24 is small or narrow. For example, in one arrangement, the frame 26 is roughly 11 inches wide, and the pedestal portion 34 of the stabilization assembly 30 (when in an operating position) is roughly 24 inches wide in the same direction. Further details of the invention will now be provided with reference to FIG. 2.

Figure 2:
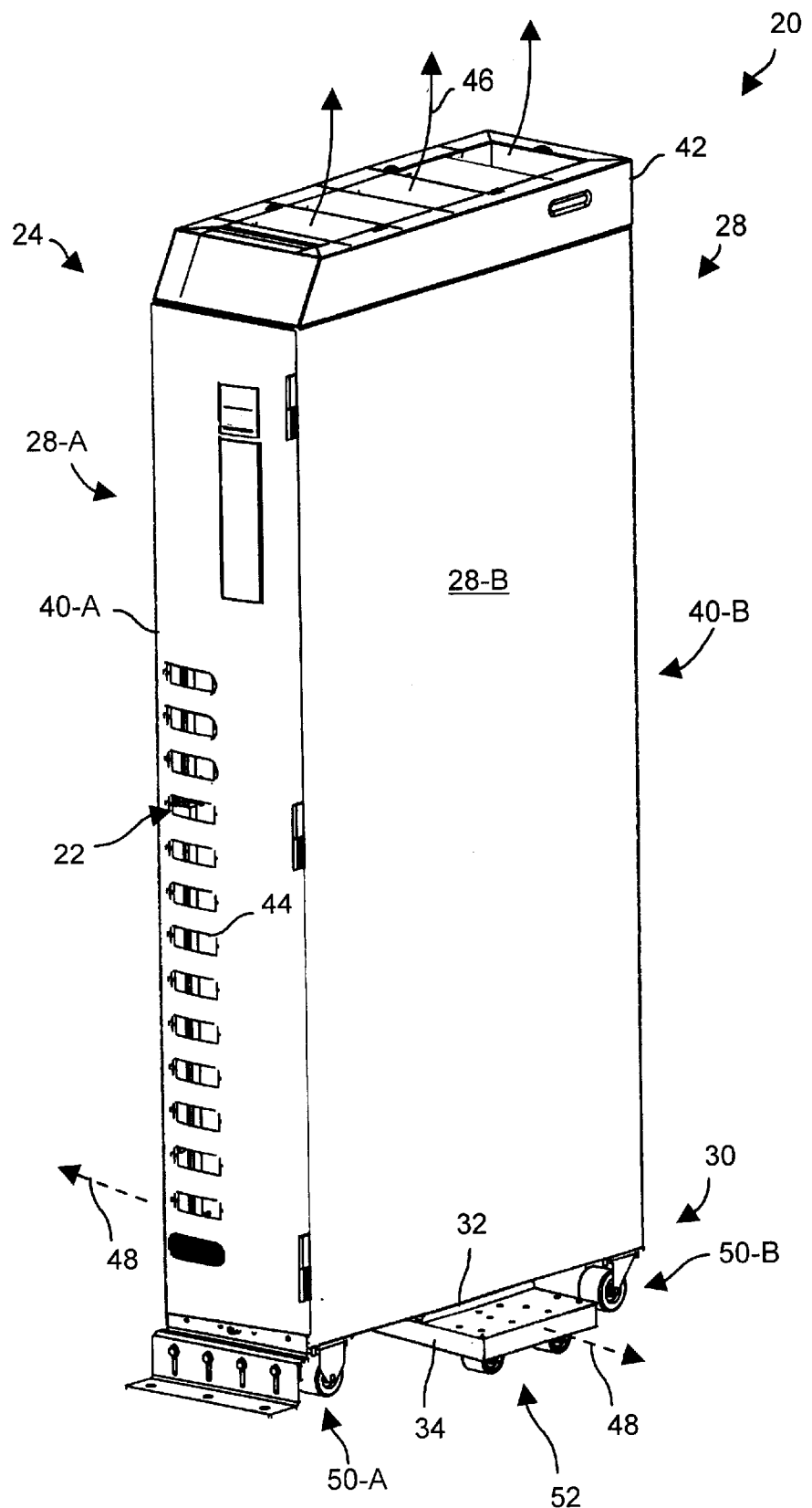
FIG. 2 shows a perspective view of the electronic system of FIG. 1.

FIG. 2 shows a perspective view of the electronic system 20. The set of exterior members 28 includes side panels 28-A, 28-B, a front door panel 40-A, a rear door panel 40-B, and a muffler 42 that resides at the top of the electronic cabinet 24. The front door panel 40-A defines holes 44 that enables a user to access and view portions of the electronic circuitry 22 housed within the electronic cabinet 24 (e.g., a control console, a display, etc.). The muffler 42 absorbs noise energy emitted by a fan assembly that is housed within the electronic cabinet 24 and that generates an air stream 46 that removes heat from the electronic circuitry 22 therein.

As shown in FIG. 2, the stabilization assembly 30 is configured such that the pedestal portion 34 (e.g., 24 inches wide) is substantially wider than the frame 26 (e.g., 11 inches wide including the side panels 28-A, 28-B) within the electronic cabinet 26 (see FIG. 1) and the base portion 32 along a particular direction 48. As will be explained in further detail shortly, the pedestal portion 34 is movable relative to the base portion and the frame 26 so that it is not always substantially wider than the base portion 32 and the frame 26.

The base portion 32 includes a set of front wheels 50-A and a set of back wheels 50-B. The pedestal portion includes a set of wheels 52 as well. The sets of wheels 50-A, 50-B and 52 facilitate movement of the electronic cabinet 24 across the floor surface 36 (see FIG. 1). That is, the sets of wheels 50-A, 50-B and 52 enable a user to roll the electronic system 20 across the floor surface 36. In one arrangement, the set of front wheels 50-A are configured to swivel thus enabling a user to steer (e.g., spin or turn) the electronic cabinet 24 when rolling the electronic cabinet 24 over a floor surface 36 (see FIG. 1).

Preferably, the pedestal portion 34 is dimensioned relative to the base portion 32 such that the pedestal portion 34 holds the set of wheels 52 at a height that is slightly higher than the sets of wheels 50-A. 50-B of the base portion 32 when the sets of wheels 50-A, 50-B contacts the floor surface 36. Accordingly, the sets of wheels 52 only touch the floor surface 36 when the floor surface 36 is slightly uneven or when the electronic cabinet 24 is slightly tipped sideways. In such situations, the pedestal portion 34 provides stabilization to the electronic cabinet 24, e.g., prevents the electronic cabinet 24 from tipping over. Further details of the invention will now be provided with reference to FIGS. 3 through 5.

Figure 3:
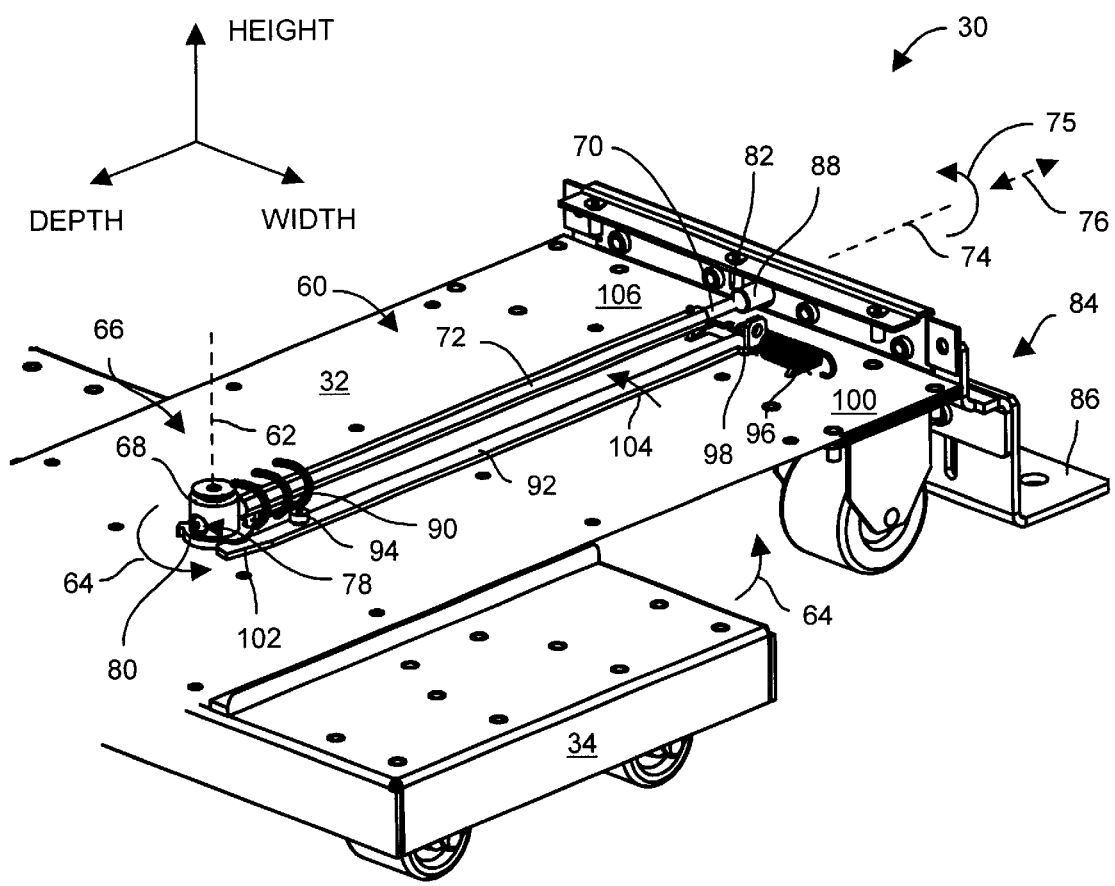
FIG. 3 shows a perspective view of a stabilization assembly of the electronic system of FIG. 1 when in an operating position.

FIG. 3 shows a perspective view of the stabilization assembly 30 when the pedestal portion 34 is in an operating position relative to the base portion 32. The stabilization assembly 30 includes, in addition to the base portion 32 and the pedestal portion 34, a positioner 60 which couples the pedestal portion 34 to the base portion 32 and enables the pedestal portion 34 to pivot about of the base portion 32, i.e., about an axis 62 (see arrows 64). In particular, the positioner 60 is configured to selectively (i) permit the pedestal portion 34 to rotate relative to the base portion 32, and (ii) prevent the pedestal portion 34 from substantially rotating relative to the base portion 32. To this end, the positioner 60 includes a locking mechanism 66 having a hub 68, and a locking bar 70, and a sleeve 72. The hub 68 connects with the pedestal portion 34 and thus rotates about the axis 62 when the pedestal portion 34 rotates about that axis 62. The sleeve 72 connects with the base portion 32 and retains the locking bar 70 such that the locking bar 72 can only rotate about a central axis 74 (e.g., see arrow 75) or move along the central axis 74, i.e., move transversely along a direction 76.

Figure 4:
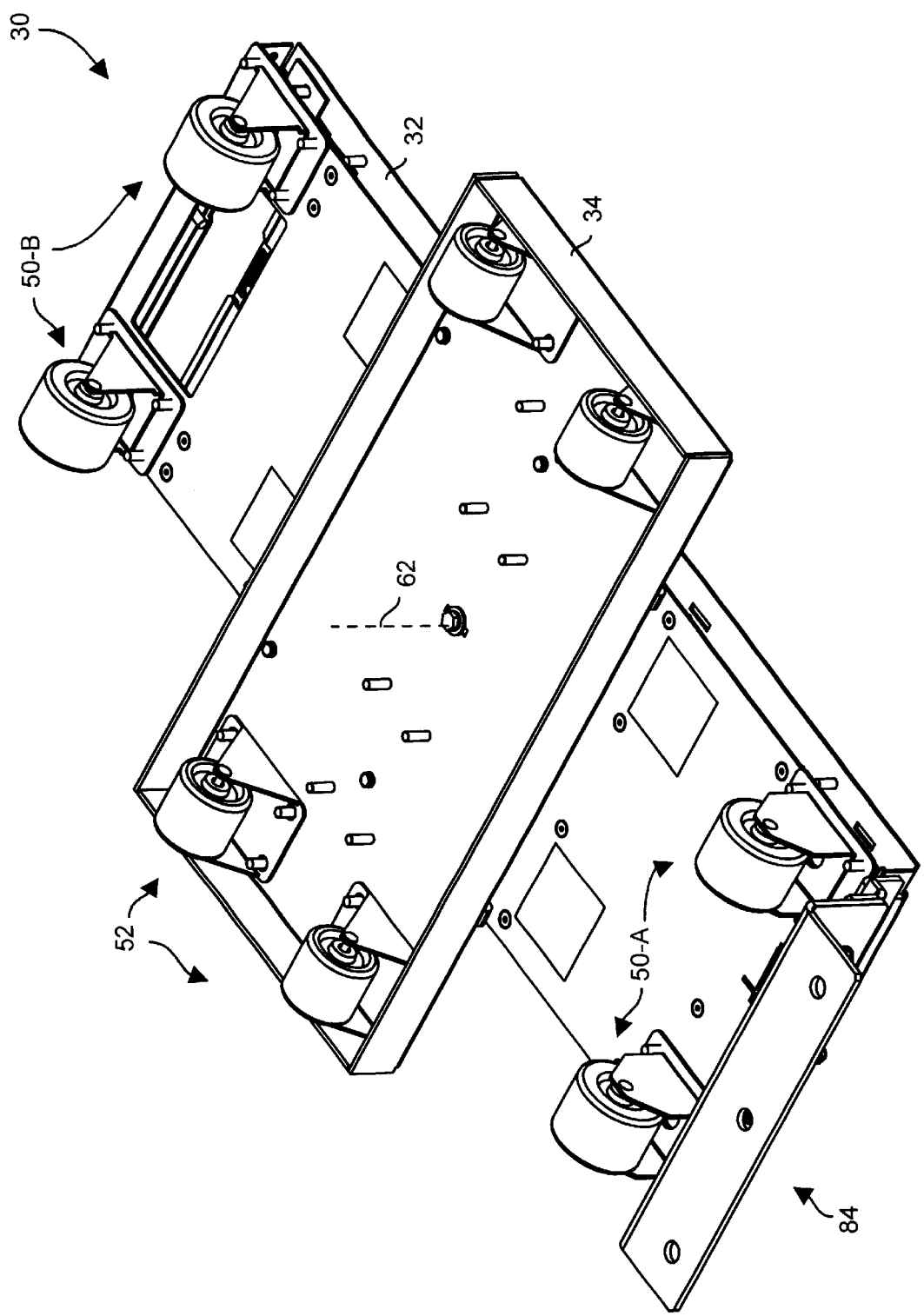
FIG. 4 shows a bottom view of the stabilization assembly of FIG. 3.

FIG. 4 shows a bottom view of the stabilization assembly 30 when the pedestal portion 34 is in the operating position. That is, a user has rotated the pedestal portion 34 such that it is substantially perpendicular relative to the base portion 32.

Figure 5:
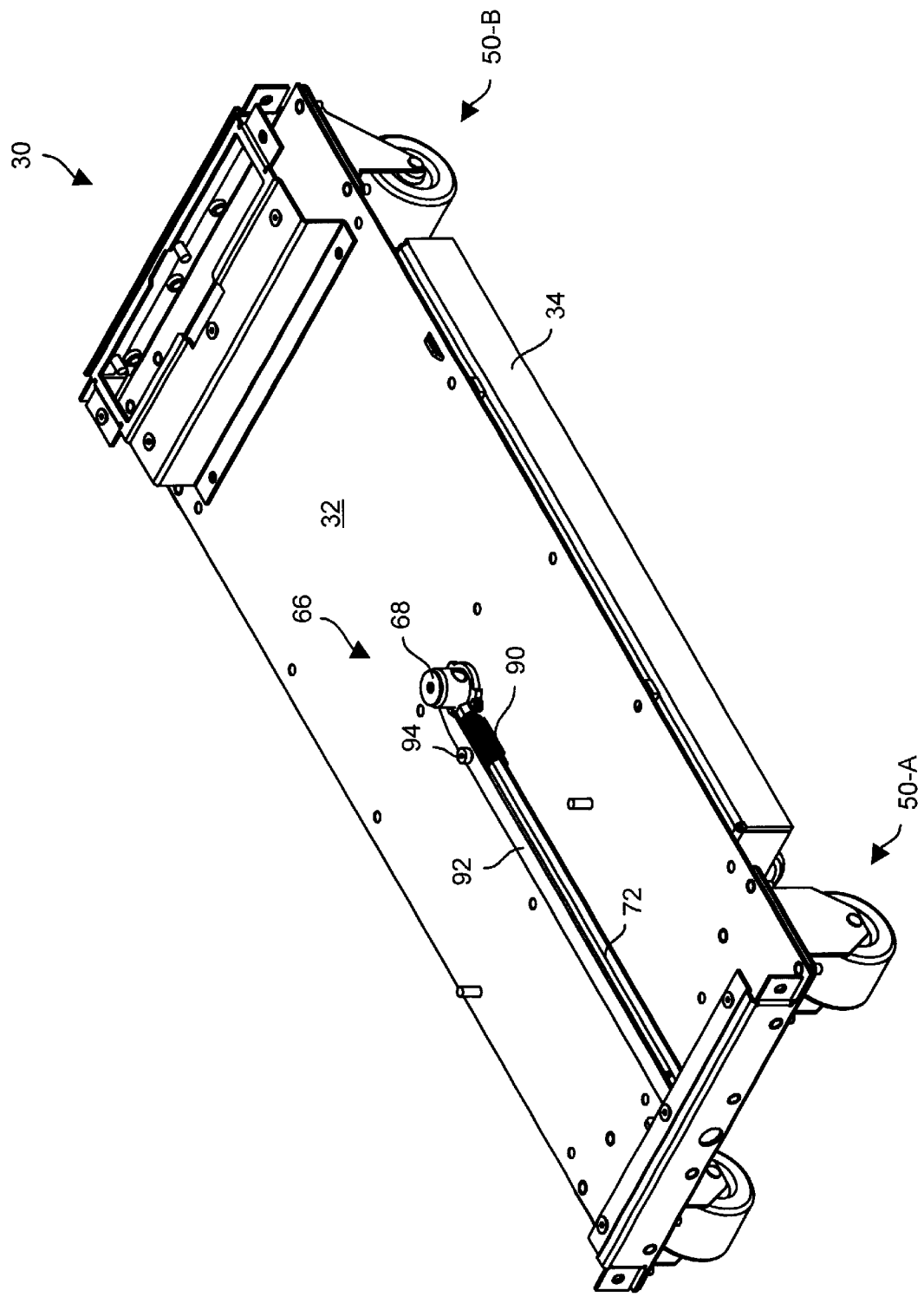
FIG. 5 shows a perspective view of the stabilization assembly of FIG. 3 when in a non-operating position.

With reference back to FIG. 3, the locking mechanism 66 enables the pedestal portion 34 to substantially turn relative to the base portion 32 when in an unlocked state, and blocks the pedestal portion 34 from substantially turning relative to the base portion 32 when in a locked state. That is, when the locking mechanism 66 is in the unlocked state, the pedestal portion 34 is free to substantially rotate relative to the base portion 32. For example, and as shown in FIG. 5, a user can rotate the pedestal portion 34 such that it is even with the base portion 32, i.e., such that the pedestal portion 34 is in a non-operating position (no longer stabilizing the electronic cabinet 24) and is no longer substantially wider than the base portion 32. In one arrangement, the pedestal portion 34 is roughly the same width as the base portion 32 (e.g., 11 inches wide) when the pedestal portion is in the non-operating position. However, when the locking mechanism 66 is in the locked state, the pedestal portion 34 is prevented from substantially rotating relative to the base portion 32 and is held in a substantially perpendicular orientation relative to the base portion 32 (see FIGS. 3 and 4), i.e., such that the pedestal portion is in the operating position (stabilizing the electronic cabinet 24) and substantially wider than the base portion 32.

As further shown in FIG. 3, the hub 68 defines a hub cavity 78. An end 80 of the locking bar 70 is configured to engage and disengage with the hub cavity 78 depending on the rotational position of the hub 68 and the transverse position of the locking bar along the axis 74. When the end 80 of the locking bar 70 engages the hub cavity 78, the locking mechanism 66 is in the locked state and the pedestal portion 34 cannot substantially rotate about the axis 62. However, when the end 80 of the locking bar 70 is disengaged from the hub cavity 78, the pedestal portion 34 can substantial rotate about the axis 62 (see arrows 64).

As also shown in FIG. 3, the positioner 60 further includes a bracket 84 having a flanged portion 86 that fastens to the base portion 32, and a movable portion 88 that is movable relative to the flanged portion 86 and that meshes with an end 82 of the locking bar 70 which is opposite the locking bar end 80. To this end, the locking bar end 82 is externally threaded, and the movable portion 88 (e.g., a nut retained by the flanged portion 86) is internally threaded and capable of rotating relative to the flanged portion 86 of the bracket 84.

A user (e.g., an installer) can operate the locking mechanism 66 (i.e., lock and unlock the locking mechanism 66) by turning the movable portion 88. For example, when the user turns the movable portion 88 in a first direction (e.g., clockwise), the locking bar 70 threads further into the movable portion 88 and thus moves toward the bracket 84 along the axis 74. Accordingly, if the locking bar end 80 is engaged with the hub 68, the user can unlock the locking mechanism 66 by rotating the movable portion 88 in the first direction.

In contrast, when the user turns the movable portion 88 in a second direction (e.g., counter clockwise) which is opposite the first direction, the locking bar 70 threads away from the movable portion 88 (i.e., unthreads from the movable portion 88) and thus moves away from the bracket 84 along the axis 74. Accordingly, if the locking bar end 80 is disengaged with the hub 68 but aligned with the hub cavity 78, the user can lock the locking mechanism 66 by rotating the movable portion 88 in the second direction. As a result, the locking bar end 80 engages with the hub cavity 78 to lock the pedestal portion 34 in place relative to the base portion 32 (i.e., to prevent the pedestal portion 34 from substantially rotating). Thus, the user can selectively lock and unlock the pedestal portion 34 by turning the movable portion 88.

As further shown in FIG. 3, the positioner 60 further includes a spring 90 that connects the locking bar 70 to the base portion 32. Accordingly, when the user turns the movable portion 88 to move the locking bar 70 toward the bracket 84, the spring 90 provides a retaining force that pulls (i.e., draws) the locking bar 70 in the opposite direction away from the bracket 84. It should be understood that the bracket 84 is removable from the stabilization assembly 30. When the bracket 84 is removed from the stabilization assembly 30, the spring 90 retains the locking bar 70 relatively close to the hub 68 and such that only the locking bar end 82 is visible to the user. Preferably, when the bracket 84 is removed, the locking bar end 82 does not extend out far enough to enable a user to grab it or move it with a bare hand.

It should be understood that, when the bracket 84 is in place (i.e., attached to the base portion 32), the flanged portion 86 of the bracket 84 can be fastened to a surface for further stabilization. For example, a user can fasten the flanged portion 86 to a palette during shipping of the electronic system 20. As another example, the user can fasten the flanged portion 86 to a floor for further stabilization of the electronic cabinet 24 (e.g., for earthquake protection). Even if the flanged portion 86 of the bracket 84 is simply in place but not fastened to anything external, the bracket 84 provides stabilization for the electronic cabinet 24 since it is flush or close to being flush with a floor surface and thus will provide support against the floor surface if the electronic cabinet 24 is tipped slightly (also see FIG. 1).

Also shown in FIG. 3 is an actuating rod 92, a pivot member 94 and a spring 96. The pivot member 94 fastens the actuating rod 92 to the base portion 32 and allows the actuating rod to pivot. The spring 96 fastens to an end 98 of the actuating rod 92 and the base portion 32 in order to pull the actuating rod end 98 toward a location 100 on the base portion 32. Due to force from the spring 96, an end 102 (opposite the end 98) constantly contacts the hub 68. When the hub 68 rotates about the axis 62, the hub 68 is capable of moving the actuating rod 92 about the pivot member 94 in a direction 104 toward a location 106 of the base portion 32. As will be described shortly, the position of the end 98 of the actuating rod 92 (e.g., closer to the location 100 or closer to the location 106) dictates whether the bracket 84 can be removed from the pedestal portion 34.

It should be further understood that, when the pedestal portion 34 is in the operating position relative to the base portion 32 as shown in FIG. 3, the pedestal portion 34 has a pedestal width (e.g., 24 inches), a pedestal depth (e.g., 11 inches) and a pedestal height (e.g., two inches). Similarly, the base portion 32 has a base width (e.g., 11 inches), a base depth and a base height. The pedestal width is substantially wider than the base width. Additionally, the pedestal width is at least slightly shorter than depth between the front and back wheels 50-A, 50-B of the base portion 32 so that the pedestal portion 34 can rotate into a non-operating position fully underneath the base portion 32 (see FIG. 5). Further details of the invention will now be provided with reference to FIGS. 6 and 7.

Figure 6:
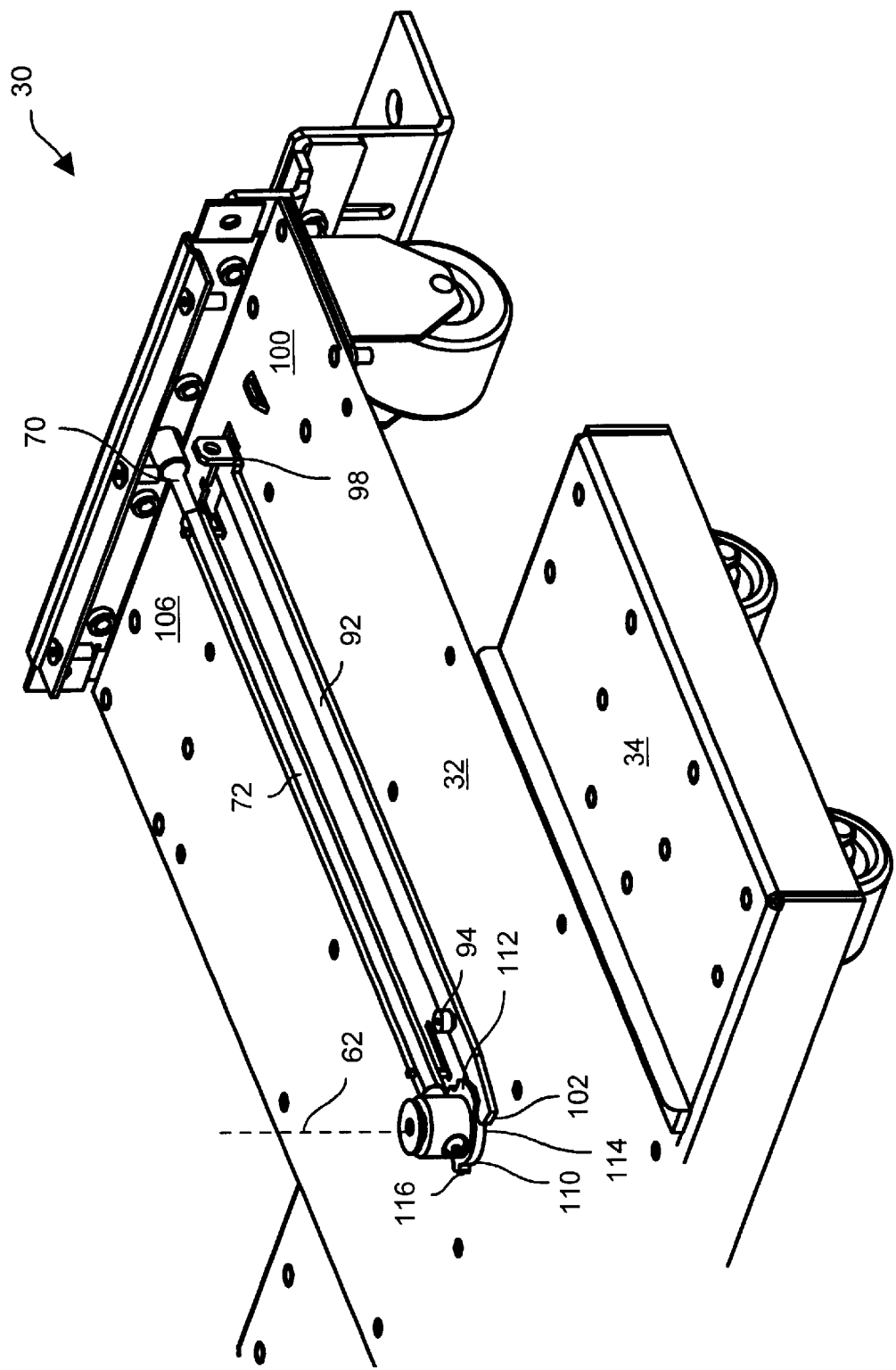
FIG. 6 shows a perspective view of particular portions of the stabilization assembly of FIG. 3.

FIG. 6 shows particular portions of the stabilization assembly 30. The springs 90, 96 (see FIG. 3) have been omitted in order to better illustrate other features of the stabilization assembly 30. The hub 68 includes a cam portion 110 having lobed section 112, a non-lobed section 114, and a tab 116. As the hub 68 rotates, the cam portion 110 pushes against the end 102 of the actuating bar 92. In particular, when the lobed section 112 pushes against the end 102, the opposite end 98 of the actuating bar 92 is closer to the location 106 due to pivoting around the pivot member 94 (see FIG. 3). When the non-lobed section 114 pushes against the end 102, the opposite end 98 of the actuating bar 92 is closer to the location 100 (due to the pulling action of the spring 96, see FIG. 3). The tab 116 prevents the hub 68 (and the pedestal portion 34) from further rotating relative to the base portion 32, i.e., from rotating completely about the axis 62.

Figure 7:
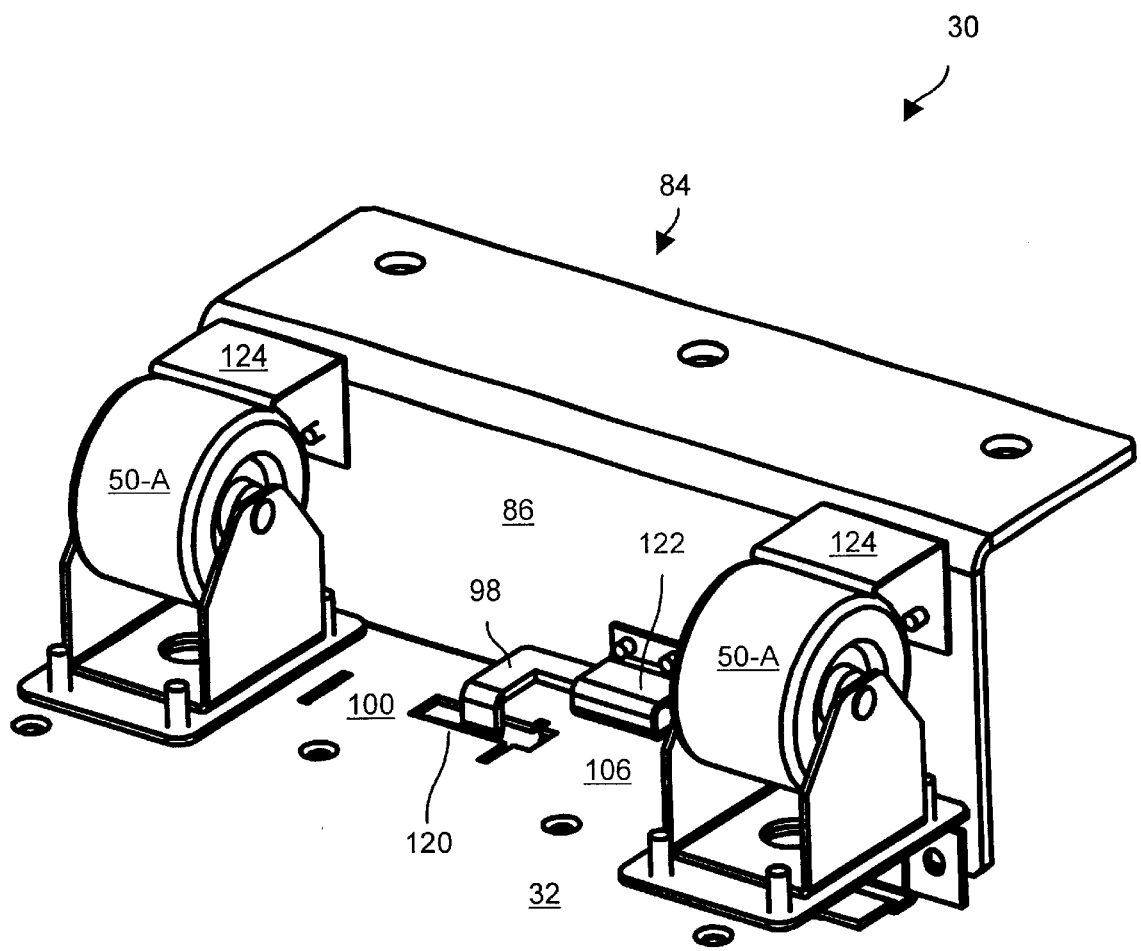
FIG. 7 shows a back view of a bracket of the stabilization assembly of FIG. 3.

FIG. 7 shows a back view of the bracket 84 and an underside of the pedestal portion 34. The end 98 of the actuating bar 92 extends through a hole 120 defined by the pedestal portion 34. The bracket 84 includes a U-shaped member 122 which fastens to the flange portion 86 of the bracket 84. The end 98 operates as a bracket retaining arm that selectively retains or releases the bracket 84. That is, when the actuating bar end 98 is closer to the location 100, the actuating bar end 98 does not engage with the U-shaped member 122 and a user can remove the bracket 84 from the stabilization assembly 30. However, when the actuating bar end 98 is closer to the location 106, the actuating bar end 98 engages with the U-shaped member 122 and a user cannot remove the bracket 84 from the stabilization assembly 30.

It should be understood that the cam portion 110 of the hub 68.moves the actuating bar end 98 closer to the location 100 so that the bracket 84 is removable when the locking mechanism 66 is in the locked state, i.e., when the locking rod 70 engages with the hub 68. Accordingly, the pedestal portion 34 is in an operating position relative to the base portion 32 (i.e., is stabilizing the electronic cabinet) so that it is safe for the user to remove the bracket 84.

In contrast, the cam portion 110 of the hub 68 moves the actuating bar end 98 closer to the location 106 so that the bracket 84 cannot be removed when the locking mechanism 66 is in the unlocked state, i.e., when the locking rod 70 is disengaged from the hub 68. As such, the pedestal portion 34 either in the non-operating position relative to the base portion 32 (i.e., is no longer stabilizing the electronic cabinet) or free to rotate to the non-operating position so that it is unsafe for the user to remove the bracket 84. Accordingly, the actuating bar end 98 engages the U-shaped member 120 of the bracket 84 to prevent the user from removing the bracket 84. As a result, the bracket 84 continues to provide stabilization to the electronic cabinet 24 (FIG. 1), even when the pedestal portion 34 is no longer in the operating position.

As further shown in FIG. 7, the bracket 84 further includes a set of brake members 124. The brake members 124 contact the front wheels 50-A of the base portion 32 when the bracket is attached to the base portion 32. In particular, the brake members 124 provide friction to the front wheels 50 preventing the wheels 50 from rotating when the bracket 84 is connected with the base portion 32. Accordingly, the front wheels 50-A wheels, and thus the electronic cabinet, is restricted from moving (e.g., prevented from easily rolling across the floor) when the bracket 84 is in place within the stabilization assembly 30. However, when the bracket 84 is removed from the stabilization assembly 30 (recall that the pedestal portion 34 must be in the operating position for the bracket 84 to be removed), the wheels 50-A, 50B, and thus the electronic cabinet, can be rolled across the floor. Further details of the invention will now be provided with reference to FIG. 8.

Figure 8:
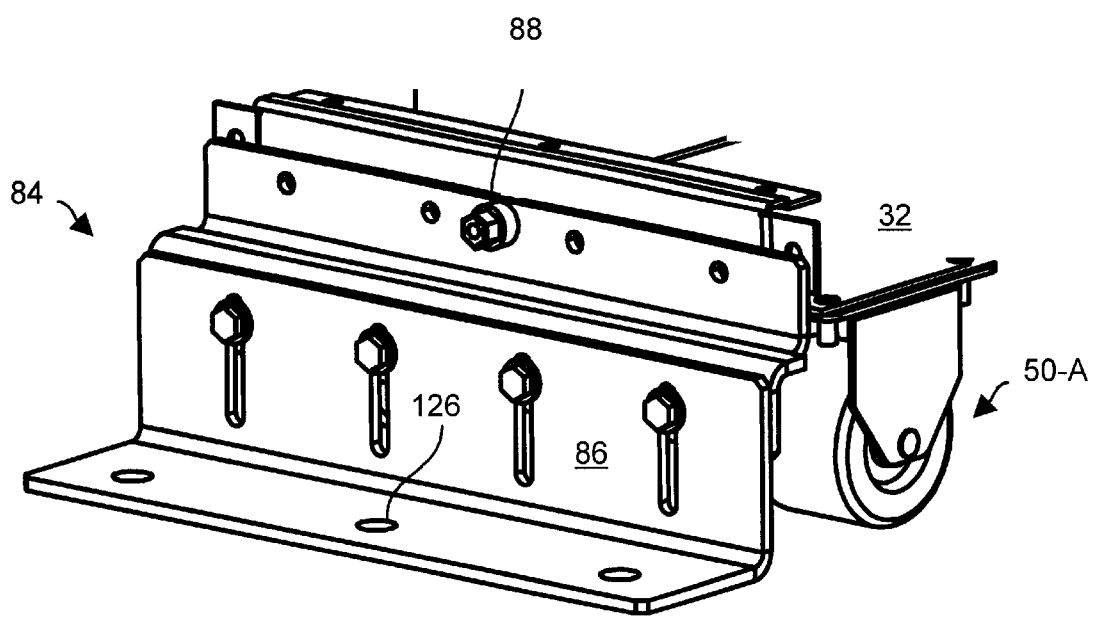
FIG. 8 shows a front view of the bracket of FIG. 5.

FIG. 8 shows a front view of the bracket 84. In one arrangement and as shown, the movable member 88 can have a specialized shape (e.g., a hexagonal shape) that requires a special tool (e.g., only available to qualified installers) thus limiting those who are capable of unlocking and re-locking the pedestal portion 34 relative to the base portion 32. As also shown, the flange portion 86 of the bracket 84 can define holes 126 for mounting the bracket 84 (and thus the electronic cabinet 24) to a fixed surface (e.g., a palette, a floor, etc.). In one arrangement, the end 82 of the locking bar 70 is substantially hidden from view by the base portion 32. in this arrangement, the base portion 32 preferably defines a hole around the movable member 88. In particular, the base portion 32 recesses the end 82 of the locking bar 70 (see FIG. 5) preventing a user from manually grabbing the locking bar end 82 with a bare hand and requiring the user to use put the bracket 84 in place in order to actuate the locking bar 70. Accordingly, the bracket 84 must be in place and provides stability when unlocking the pedestal member from the operating position. Further details of the invention will now be provided with reference to FIG. 9.

Figure 9:
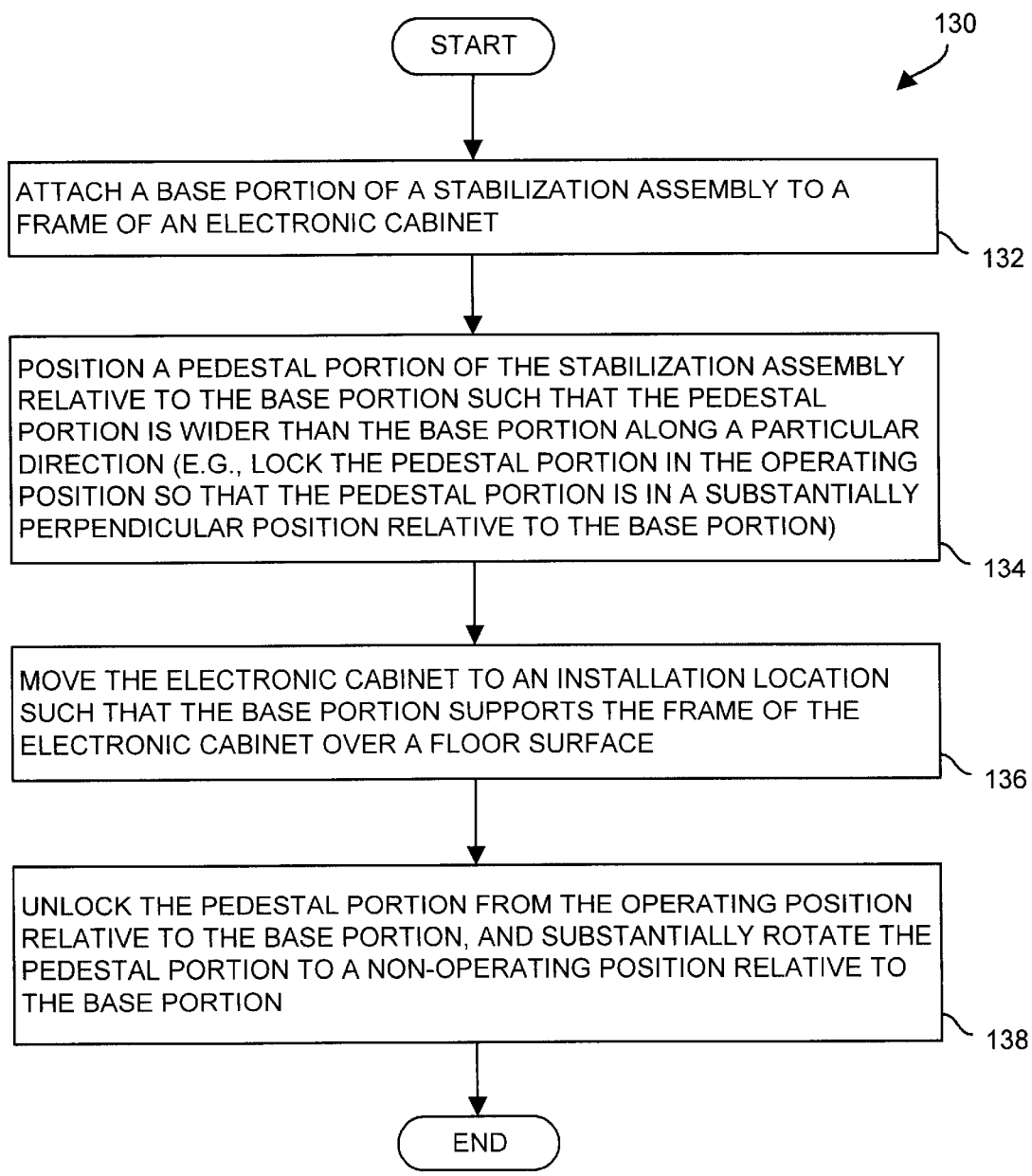
FIG. 9 shows a flowchart of a procedure for operating the stabilization assembly of FIG. 3.

FIG. 9 shows a flowchart of a procedure 132 for installing the electronic system The steps of the procedure 132 can be performed by a manufacturer of the electronic system 20 and/or a customer (e.g., an installer at an installation site). The procedure 132 will be hereinafter described as being performed by a user which generally refers to anyone operating the electronic system 20 (a manufacturer of the electronic system, a manufacturer of just the frame 24, a customer, etc.).

In step 132, the user attaches the base portion 32 of the stabilization assembly 30 to the frame 26 of the electronic cabinet 24. In one arrangement, the base portion 32 fastens to the frame 26 using hardware (e.g., nuts and bolts, screws, etc.). In another arrangement, the base portion 32 fastens to the frame 26 via a series of welds. In other arrangements, the base portion 32 attaches to the frame 26 using other similar fastening mechanisms.

In step 134, the user positions the pedestal portion 34 of the stabilization assembly 30 relative to the base portion 32 such that the pedestal portion 34 is in the operating position and is substantially wider than the base portion 32 along a particular direction. In particular, the user locks the pedestal portion 34 in the operating position so that the pedestal portion 34 is substantially perpendicular relative to the base portion 32.

In step 136, the user moves the electronic cabinet 24 to an installation location such that the base portion 32 supports the frame 26 of the electronic cabinet over the floor surface (also see FIG. 1). Since the pedestal portion 34 is locked in the operating position, the stabilization assembly 30 provides stability to the electronic system 20. In particular, the pedestal portion 34 prevents the electronic cabinet 24 from inadvertently tipping over when the user moves the electronic cabinet 24 to the installation location (e.g., a computer room or lab area). At this point, the user can power up and operate the electronic circuitry 22 of the electronic system 20 (e.g., the user can plug in and boot the computer system). However, in some installation locations, space is limited. In such limited space situations, the user can proceed to step 138.

In step 138, the user unlocks the pedestal portion 34 from the operating position relative to the base portion 32, and substantially rotates the pedestal portion 34 to the non-operating position relative to the base portion 32. If the bracket 84 (FIG. 5) has been removed prior to step 138, the user re-attaches the bracket 84 to the base portion 32 prior to unlocking the pedestal portion 34 (recall that the bracket 84 is needed in order to disengage the locking bar 70 from the hub 68). At this point, the pedestal portion 32 no longer provides stability to the electronic cabinet 24 and tucked underneath the base portion 32. However, the bracket 84, which can be fastened (e.g., bolted) to the floor, is present and stabilizes the electronic cabinet 24. Since the pedestal portion 32 is now out of the way, other electronic equipment (e.g., other cabinets) can be positioned adjacent the electronic system 20 in order to maximize utilization of floor space. The electronic system 20 is at low risk for tipping over since the neighboring cabinets will prevent a user from inadvertently pushing against the electronic cabinet 24 and knocking it over.

As described above, embodiments of the invention are directed to techniques for installing an electronic cabinet 24 (e.g., a computer cabinet) using a pedestal 34 that is substantially wider than a cabinet frame 26 along a particular direction. The pedestal 34 enables the electronic cabinet 24 to have a different footprint (e.g., narrower dimensions) than a standard full-sized computer cabinet, and prevents the electronic cabinet 24 from easily tipping over and/or posing a safety hazard. The features of the invention, as described above, may be employed in data storage systems, apparatus and methods as well as other computer-related components such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the electronic cabinet 24 was shown above as being a full height cabinet by way of example only. In other arrangements, the electronic cabinet 24 is a different height (e.g., a half-height cabinet).

Additionally, the stabilization assembly 30 can include multiple brackets 84 rather than a single bracket. That is, in addition to the bracket 84 that fastens to the base portion 32 at the front of the stabilization assembly 30, the stabilization assembly 30 can include another bracket 84 that fastens to the base portion 32 at the back of the stabilization assembly 30 for further stabilization and enabling the user to fasten the electronic cabinet 24 to a fixed surface at both the front and back.

What is claimed is:

1. An electronic system, comprising:
   electronic circuitry;
   an electronic cabinet that houses the electronic circuitry, the electronic cabinet including:
   (a) a frame that holds the electronic circuitry;
   (b) a set of exterior members that mounts to the frame; and
   (c) a stabilization assembly having:
   (i) a base portion that attaches to the frame of the electronic cabinet in order to support the frame of the electronic cabinet over a floor surface;
   (ii) a pedestal portion which is configured to pivot relative to the base portion substantially in a horizontal plane; and
   (iii) a positioner that is configured to position the pedestal portion of the stabilization assembly relative to the frame such that the pedestal portion of the stabilization assembly is substantially wider than the frame along a particular direction when the pedestal of the stabilization assembly portion resides in an operating position relative to the frame.

2. The electronic system of claim 1 wherein the positioner of the stabilization assembly couples the pedestal portion of the stabilization assembly to the base portion of the stabilization assembly, and is configured to enable the pedestal portion of the stabilization assembly to pivot about the frame.

3. The electronic system of claim 1 wherein the positioner of the stabilization assembly is configured to selectively (i) permit the pedestal portion of the stabilization assembly to substantially rotate relative to the frame, and (ii) prevent the pedestal portion of the stabilization assembly from substantially rotating relative to the frame.

4. The electronic system of claim 3 wherein the positioner of the stabilization assembly includes:
   a locking mechanism that (i) enables the pedestal portion of the stabilization assembly to substantially rotate relative to the frame when in an unlocked state, and (ii) blocks the pedestal portion of the stabilization assembly from substantially rotating relative to the frame when in a locked state.

5. An electronic cabinet, comprising:
   (a) a frame to hold electronic circuitry;
   (b) a set of exterior members that mounts to the frame; and
   (c) a stabilization assembly having:
   (i) a base portion that attaches to the frame in order to support the frame over a floor surface;
   (ii) a pedestal portion which is configured to pivot relative to the base portion substantially in a horizontal plane; and
   (iii) a positioner that is configured to position the pedestal portion relative to the frame to make the pedestal portion substantially wider than the frame along a particular direction when the pedestal portion resides in an operating position relative to the frame.

6. The electronic cabinet of claim 5 wherein the positioner of the stabilization assembly couples the pedestal portion of the stabilization assembly to the base portion of the stabilization assembly, and is configured to enable the pedestal portion of the stabilization assembly to pivot about the frame.

7. The electronic cabinet of claim 5 wherein the positioner of the stabilization assembly is configured to selectively (i) permit the pedestal portion of the stabilization assembly to substantially rotate relative to the frame, and (ii) prevent the pedestal portion of the stabilization assembly from substantially rotating relative to the frame.

8. The electronic cabinet of claim 7 wherein the positioner of the stabilization assembly includes:
a locking mechanism that (i) enables the pedestal portion of the stabilization assembly to substantially rotate relative to the frame when in an unlocked state, and (ii) blocks the pedestal portion of the stabilization assembly from substantially rotating relative to the frame when in a locked state.

9. An assembly for stabilizing an electronic cabinet, comprising:
a base portion to attach to a frame of the electronic cabinet in order to support the frame of the electronic cabinet over a floor surface;
a pedestal portion which is configured to pivot relative to the base portion substantially in a horizontal plane; and
a positioner that is configured to position the pedestal portion relative to the base portion such that the pedestal portion is substantially wider than the base portion along a particular direction when the pedestal portion resides in an operating position relative to the base portion.

10. The assembly of claim 9 wherein the positioner couples the pedestal portion to the base portion, and is configured to enable the pedestal portion to pivot about the base portion.

11. The assembly of claim 9 wherein the positioner is configured to selectively (i) permit the pedestal portion to substantially rotate relative to the base portion, and (ii) prevent the pedestal portion from substantially rotating relative to the base portion.

12. The assembly of claim 11 wherein the positioner includes:
a locking mechanism that (i) enables the pedestal portion to substantially rotate relative to the base portion when in an unlocked state, and (ii) blocks the pedestal portion from substantially rotating relative to the base portion when in a locked state.

13. The assembly of claim 9 wherein the pedestal portion is configured to pivot relative to the base portion about an axis that substantially extends through the frame of the electronic cabinet when the base portion attaches to the frame of the electronic cabinet.

14. An assembly for stabilizing an electronic cabinet, comprising:
a base portion to attach to a frame of the electronic cabinet in order to support the frame of the electronic cabinet over a floor surface;
a pedestal portion; and
a positioner that is configured to position the pedestal portion relative to the base portion such that the pedestal portion is substantially wider than the base portion along a particular direction when the pedestal portion resides in an operating position relative to the base portion, wherein the positioner is configured to selectively (i) permit the pedestal portion to substantially rotate relative to the base portion, and (ii) prevent the pedestal portion from substantially rotating relative to the base portion; wherein the positioner includes a locking mechanism that (i) enables the pedestal portion to substantially rotate relative to the base portion when in an unlocked state, and (ii) blocks the pedestal portion from substantially rotating relative to the base portion when in a locked state; and wherein the locking mechanism includes:
a hub that connects with the pedestal portion; and
a locking bar coupled to the base portion, the locking mechanism being in the unlocked state when the locking bar is disengaged from the hub and in the locked state when the locking bar is engaged with the hub.

15. The assembly of claim 14 wherein the positioner further includes:
a bracket having a flanged portion that fastens to the base portion, and a movable portion that is movable relative to the flanged portion and that meshes with the locking bar in order to enable the locking bar to selectively engage with and disengage from the hub when a user moves the movable portion.

16. The assembly of claim 15 wherein the base portion includes a pair of wheels, wherein the pair of wheels facilitate movement of the assembly along the floor surface when the bracket is removed from the base portion, and wherein the pair of wheels are substantially prevented from rotating in order to inhibit movement of the assembly along the floor surface when the bracket is fastened to the base portion.

17. The assembly of claim 15 wherein the positioner further includes:
a bracket retaining arm, coupled to the base portion, that prevents removal of the bracket from the base portion when the pedestal portion resides in a non-operating position relative to the base portion.

18. The assembly of claim 12 wherein the locking mechanism is configured to hold the pedestal portion in a substantially perpendicular position relative to the base portion when in the locked state.

19. An assembly for stabilizing an electronic cabinet, comprising:
a base portion to attach to a frame of the electronic cabinet in order to support the frame of the electronic cabinet over a floor surface;
a pedestal portion; and
a positioner that is configured to position the pedestal portion relative to the base portion such that the pedestal portion is substantially wider than the base portion along a particular direction when the pedestal portion resides in an operating position relative to the base portion, wherein the positioner is configured to selectively (i) permit the pedestal portion to substantially rotate relative to the base portion, and (ii) prevent the pedestal portion from substantially rotating relative to the base portion, and wherein the base portion includes a first set of wheels, wherein the pedestal portion includes a second set of wheels, and wherein the first and second set of wheels facilitate movement of the assembly along the floor surface.

20. The assembly of claim 19 wherein the second set of wheels of the pedestal portion reside at a height that is higher than the first set of wheels of the base portion when the first set of wheels contact the floor surface.

21. A method for installing an electronic cabinet, the method comprising:
- attaching a base portion of a stabilization assembly to a frame of the electronic cabinet;
- positioning a pedestal portion of the stabilization assembly, which is coupled to the base portion of the stabilization assembly, in an operating position relative to the frame such that the pedestal portion is substantially wider than the frame along a particular direction, the pedestal portion pivoting relative to the base portion substantially in a horizontal plane when positioning the pedestal portion in the operating position; and
- moving the electronic cabinet to an installation location such that the base portion supports the frame of the electronic cabinet over a floor surface.

22. The method of claim 21 wherein positioning includes:
- pivoting the pedestal portion of the stabilization assembly about the frame until the pedestal portion of the stabilization assembly is in the operating position relative to the frame.

23. The method of claim 21 wherein positioning includes:
- locking the pedestal portion in the operating position relative to the frame in order to block the pedestal portion from substantially rotating relative to the frame.

24. The method of claim 23 wherein locking includes:
- holding the pedestal portion in a substantially perpendicular position relative to the frame.

25. The method of claim 23 further comprising:
- unlocking the pedestal portion from the operating position relative to the frame; and
- substantially-rotating the pedestal portion to a non-operating position relative to the frame.

26. An assembly for stabilizing an electronic cabinet, comprising:
- a base portion to attach to a frame of the electronic cabinet in order to support the frame of the electronic cabinet over a floor surface;
- a pedestal portion; and
- a positioner that is configured to position the pedestal portion relative to the base portion such that the pedestal portion is substantially wider than the base portion along a particular direction when the pedestal portion resides in an operating position relative to the base portion, wherein the pedestal portion is configured to pivot relative to the base portion in a plane which is substantially parallel to the floor surface.

27. An assembly for stabilizing an electronic cabinet, comprising:
- a base portion which is configured to attach to a frame of the electronic cabinet to support the frame of the electronic cabinet over a floor surface;
- a pedestal portion which is configured to pivot relative to the base portion in a plane which is substantially parallel to the floor surface; and
- a positioner coupled to the base portion, the positioner being configured to position the pedestal portion relative to the base portion selectively in one of (i) a first orientation in which the pedestal portion is substantially wider than the base portion along a particular direction and (ii) a second orientation in which the pedestal portion is not substantially wider than the base portion along the particular direction.

* * * * *